(12) United States Patent
Richter et al.

(10) Patent No.: US 11,568,779 B2
(45) Date of Patent: Jan. 31, 2023

(54) METHOD AND DISPLAY DEVICE FOR REDUCING SWITCH-ON DELAY BETWEEN DIFFERENT LIGHT EMISSION COMPONENTS

(71) Applicant: OSRAM Opto Semiconductors GmbH, Regensburg (DE)

(72) Inventors: Daniel Richter, Bad Abbach (DE); Sven Weber-Rabsilber, Neutraubling (DE); Marcel Severin, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 17/439,165

(22) PCT Filed: Feb. 25, 2020

(86) PCT No.: PCT/EP2020/054899
§ 371 (c)(1),
(2) Date: Sep. 14, 2021

(87) PCT Pub. No.: WO2020/182465
PCT Pub. Date: Sep. 17, 2020

(65) Prior Publication Data
US 2022/0165192 A1 May 26, 2022

(30) Foreign Application Priority Data
Mar. 14, 2019 (DE) ................... 10 2019 106 527.5

(51) Int. Cl.
*G09G 3/20* (2006.01)
*G09G 3/32* (2016.01)

(52) U.S. Cl.
CPC ........... *G09G 3/20* (2013.01); *G09G 2310/08* (2013.01); *G09G 2320/0223* (2013.01)

(58) Field of Classification Search
None
See application file for complete search history.

(56) References Cited

U.S. PATENT DOCUMENTS

| 8,245,072 B2 * | 8/2012 | Ideura | H04N 5/08 713/400 |
| 2003/0107537 A1 * | 6/2003 | Ochi | G09G 3/2003 345/83 |

(Continued)

FOREIGN PATENT DOCUMENTS

| DE | 689 23 683 T2 | 2/1996 |
| DE | 20 2010 008 460 U1 | 2/2011 |

(Continued)

OTHER PUBLICATIONS

International Search Report issued for corresponding International Patent Application No. PCT/EP2020/054899 dated Apr. 24, 2020, along with an English translation.

(Continued)

*Primary Examiner* — Sepehr Azari
(74) *Attorney, Agent, or Firm* — Hauptman Ham, LLP (57) ABSTRACT

A method for operating a visual display apparatus is specified. The apparatus comprises a first optoelectronic semiconductor component configured to emit electromagnetic radiation of a first wavelength and comprising a first intrinsic switch-on delay. The apparatus comprises a second optoelectronic semiconductor component configured to emit electromagnetic radiation of a second wavelength and comprising a second intrinsic switch-on delay. The second wavelength is different from the first wavelength. The first semiconductor component is operated with a first operating current according to a first actuation signal. The second (Continued)

semiconductor component is operated with a second operating current according to a second actuation signal. The first and/or the second actuation signal comprise a delay clock signal selected such that emissions of electromagnetic radiation from the first and second semiconductor components comprise a switch-on delay with respect to each other that is smaller than a difference of the first and second intrinsic switch-on delays.

20 Claims, 4 Drawing Sheets

(56) References Cited

U.S. PATENT DOCUMENTS

| | | | |
|---|---|---|---|
| 2003/0128185 A1* | 7/2003 | Arai | G09G 1/285 |
| | | | 348/222.1 |
| 2005/0141237 A1* | 6/2005 | Goto | H05B 45/20 |
| | | | 362/555 |
| 2006/0262226 A1* | 11/2006 | Odryna | G09G 5/006 |
| | | | 348/649 |
| 2007/0126757 A1* | 6/2007 | Itoh | G09G 3/3258 |
| | | | 345/690 |
| 2008/0191642 A1 | 8/2008 | Slot et al. | |
| 2009/0115952 A1* | 5/2009 | Nakamura | G09G 5/026 |
| | | | 349/143 |
| 2009/0146713 A1 | 6/2009 | Senda et al. | |
| 2011/0205202 A1 | 8/2011 | Son et al. | |
| 2012/0188291 A1 | 7/2012 | Kobayashi | |
| 2012/0313922 A1 | 12/2012 | Toyomura et al. | |
| 2014/0139139 A1* | 5/2014 | Li | G09G 3/32 |
| | | | 315/297 |
| 2014/0159043 A1* | 6/2014 | Sakariya | H01L 27/156 |
| | | | 438/34 |
| 2014/0254744 A1 | 9/2014 | Umezaki | |
| 2016/0119990 A1 | 4/2016 | Williams et al. | |
| 2016/0358528 A1* | 12/2016 | Xie | G09G 3/2018 |
| 2017/0092178 A1 | 3/2017 | Lee et al. | |
| 2019/0088200 A1 | 3/2019 | Woo et al. | |
| 2020/0006401 A1 | 1/2020 | Hwang et al. | |
| 2021/0134212 A1* | 5/2021 | Kim | G09G 3/20 |

FOREIGN PATENT DOCUMENTS

| | | |
|---|---|---|
| EP | 0 878 969 A2 | 11/1998 |
| WO | 2018/163021 A1 | 9/2018 |

OTHER PUBLICATIONS

Written Opinion issued for corresponding International Patent Application No. PCT/EP2020/054899 dated Apr. 24, 2020.

"Leuchtdiode", Wikipedia, <https://de.wikipedia.org/w/index.php?title=Leuchtdiode&oldid=185909802>, along with an English machine translation of "Light-emitting diode".

Chaziachmetovas, "Driver Topology Influence on LED Luminescence Response Dynamics", Elektronika IR Electrotechnika, 2014, vol. 20, No. 5, pp. 104-107.

\* cited by examiner

METHOD AND DISPLAY DEVICE FOR REDUCING SWITCH-ON DELAY BETWEEN DIFFERENT LIGHT EMISSION COMPONENTS

CROSS REFERENCE TO RELATED APPLICATION

This application is a National Stage of International Application No. PCT/EP2020/054899, filed on Feb. 25, 2020, which designates the United States and was published in Europe, and which claims priority to German Patent Application No. 10 2019 106 527.5, filed on Mar. 14, 2019, in the German Patent Office. Both of the aforementioned applications are hereby incorporated by reference in their entireties.

A method for operating a visual display apparatus and a visual display apparatus are specified.

A task to be solved is to specify a method for operating a visual display apparatus which enables improved display of image contents.

Another task to be solved is to specify a visual display apparatus with which an improved display of image contents is enabled.

The visual display apparatus is in particular a radiation-emitting component which emits electromagnetic radiation, for example light, during operation.

According to at least one embodiment of the method for operating a visual display apparatus, the visual display apparatus comprises a first optoelectronic semiconductor component configured to emit electromagnetic radiation of a first wavelength and comprising a first intrinsic switch-on delay. The optoelectronic semiconductor component may be a light emitting diode and comprise an active region for generating electromagnetic radiation. The active region preferably includes a pn junction, a double heterostructure, a single quantum well (SQW) structure, or a multiple quantum well (MQW) structure for radiation generation.

The optoelectronic semiconductor component is configured to generate electromagnetic radiation of a first wavelength. Here and in the following, the wavelength is to be understood in particular in each case as a peak or dominant wavelength of the emitted spectrum. Thus, in particular, an optoelectronic semiconductor component arranged to emit a wavelength is not necessarily a monochromatically emitting semiconductor component. Rather, a broad emission spectrum with a particular peak or dominant wavelength may be meant.

Further, the first optoelectronic semiconductor component comprises an intrinsic switch-on delay. The intrinsic switch-on delay refers to the time period between the turn-on time of the optoelectronic semiconductor component and the start of emission of an electromagnetic radiation by the semiconductor component. The intrinsic switch-on delay of an optoelectronic semiconductor component is composed of a dead time and a rise time. During the dead time, only the parasitic capacitance of the semiconductor component is charged, while during the rise time, the first injection of charge carriers into the quantum wells of the active layer takes place and thus the emission of electromagnetic radiation begins. The rise time marks the time span from the beginning of an electromagnetic radiation emission until reaching 10% of the maximum intensity value of the radiation emission. Thus, the intrinsic switch-on delay depends inter alia on the size of the parasitic capacitance and the material system used for the optoelectronic semiconductor component. The parasitic capacitance changes with the lateral dimensioning of the semiconductor component. A lateral dimensioning can be for example a side length, but especially a surface area of the active layer of the semiconductor component. With increasing area, the parasitic capacitance of a semiconductor component also increases, and thus its intrinsic switch-on delay also increases.

According to at least one embodiment of the method for operating an optical display apparatus, the optical display apparatus comprises a second optoelectronic semiconductor component configured to emit electromagnetic radiation of a second wavelength and comprising a second intrinsic switch-on delay. The second intrinsic switch-on delay may be different from the first intrinsic switch-on delay.

According to at least one embodiment of the method for operating a visual display apparatus, the second wavelength is different from the first wavelength. With other words, the emission spectra of the first and second optoelectronic semiconductor components may be different from each other.

According to at least one embodiment of the method for operating a visual display apparatus, the first semiconductor component and the second semiconductor component are each operated with a first or a second operating current according to a first or a second actuation signal, respectively. The first and second operating currents are applied separately to the first and second optoelectronic semiconductor components in the form of first and second actuation signals, respectively. The first semiconductor component is separately drivable from the second semiconductor component. The first and second actuation signals comprise in particular a time-dependent course with discrete values in the form of a digital signal. For example, modulation of the brightness of the first and second semiconductor components can be performed by means of pulse width modulation (PWM).

According to at least one embodiment of the method for operating a visual display apparatus, the first and/or the second actuation signal each comprise a delay clock signal. The delay clock signal is selected such that the emissions of the electromagnetic radiation of the first and second semiconductor components comprise a switch-on delay with respect to each other that is smaller than a difference of the first and second intrinsic switch-on delay. The delay clock signal may comprise a discrete number of clock cycles. Delay clock signals of different lengths for different semiconductor components may reduce or compensate for a difference in the intrinsic switch-on delay of those semiconductor components.

According to at least one embodiment of the Method for operating a visual display apparatus, the visual display apparatus comprises a first optoelectronic semiconductor component configured to emit electromagnetic radiation of a first wavelength and comprising a first intrinsic switch-on delay, and the visual display apparatus comprises a second semiconductor optoelectronic optoelectronic semiconductor component configured to emit electromagnetic radiation of a second wavelength and comprising a second intrinsic switch-on delay, wherein the second wavelength is different from the first wavelength, the first semiconductor component is operated with a first operating current according to a first actuation signal, the second semiconductor component is operated with a second operating current in accordance with a second actuation signal, and wherein the first and/or the second actuation signal comprises a delay clock signal selected such that the electromagnetic radiation emissions of the first and second semiconductor components comprise a switch-on delay with respect to each other that is smaller than a difference of the first and second intrinsic switch-on delays.

A method for operating a visual display apparatus described herein is based inter alia on the following considerations: a display apparatus for displaying multicolor image content may be implemented with a plurality of different semiconductor components configured to emit electromagnetic radiation having different wavelengths. Along with this, different material systems and also different materials will be used to manufacture the different optoelectronic semiconductor components. Different intrinsic switch-on delays of the different semiconductor components can result from the different material systems, for example due to different forward voltages of the diodes. When displaying colored image content, a mixed radiation can be used, for example, to generate a mixed radiation from a superposition of three primary colors. A too large difference in the intrinsic switch-on delays can make it difficult to generate such a mixed radiation. A too large difference in the switch-on delay of the blue and green components compared to a red component could cause a shifted color impression such as a red cast for a viewer. In the case of particularly dark image content and/or a high refresh rate, this problem can also be exacerbated if the switch-on delay of the blue and green emitting semiconductor components were so large that there would no longer be sufficient emission of the blue and green emitting semiconductor components there.

The method for operating a visual display apparatus described herein makes use, inter alia, of the idea of reducing or compensating for a switch-on delay of different optoelectronic semiconductor components by means of a suitable adjustment of the lateral extent of the optoelectronic semiconductor components and a delay clock signal. The adjustment of the lateral expansion can already cause an adaption of the parasitic capacitances and thus of the intrinsic switch-on delays of the different optoelectronic semiconductor components. Any remaining difference in the intrinsic switch-on delays, for example due to manufacturing tolerances, can subsequently be further reduced or compensated with delay clock signals of different lengths.

According to at least one embodiment of the method for operating a visual display apparatus, the first and second actuation signals comprise a frequency in the range of 10 MHz to 30 MHz. In typical display systems, refresh rates of 60 Hz are typically used. This results in an available display time of 1/60 s. In order to be able to set a desired brightness with a sufficiently high dynamic range by means of PWM within the display time, a frequency of the actuation signal that is at least one order of magnitude higher is advantageous. An upper limit for the frequency of the actuation signal results inter alia from the driver circuits used for generating the actuation signals and the response times of the semiconductor components used.

According to at least one embodiment of the method for operating a visual display apparatus, the delay clock signal has a frequency in the range of 10 MHz to 30 MHz. In particular, the delay clock signal comprises the same frequency as the first and second actuation signals. This may result in a simplified realization of the driver circuit used to generate the actuation signals.

According to at least one embodiment of the method for operating a visual display apparatus, the delay clock signal comprises a predetermined number of clock cycles. Thus, the delay clock signals have a discrete length depending on the number of clock cycles. Preferably, the delay clock signal comprises at most 16 clock cycles. This discretization makes it possible to compensate for intrinsic switch-on delays whose length is greater than or equal to the length of a clock cycle of the delay clock signal. The use of as few clock cycles as possible can increase the time available for displaying the image content, which can disadvantageously improve the dynamics of the displayable brightness.

According to at least one embodiment of the method for operating an optical display apparatus, the optical display apparatus comprises a third optoelectronic semiconductor component configured to emit electromagnetic radiation of a third wavelength, comprising a third intrinsic switch-on delay, and operated with a third operating current according to a third actuation signal comprising a delay clock signal. The third wavelength is different from the first wavelength and the second wavelength. The delay clock signal is selected such that the emissions of the electromagnetic radiation of the first and third semiconductor components comprise a switch-on delay with respect to each other that is smaller than a difference of the first and third intrinsic switch-on delays and/or the emissions of the electromagnetic radiation of the second and third semiconductor components comprise a switch-on delay with respect to each other that is smaller than the difference of the second and third intrinsic switch-on delays.

According to at least one embodiment of the method for operating a visual display apparatus, the first wavelength is in the red spectral range, the second wavelength is in the green spectral range, and the third wavelength is in the blue spectral range. For example, a display apparatus for displaying colored image contents can be formed in this way. The gamut of the color space thus spanned is spanned by the corner points of the first, second and third wavelengths on a chromaticity diagram.

According to at least one embodiment of the method for operating a visual display apparatus, the luminances of the first and second semiconductor components are in a ratio of 1/10 to 1/2 inclusive and/or the luminances of the second and third semiconductor components are in a ratio of 4/1 to 15/1 inclusive. A luminance ratio of the first, second and third semiconductor components of 3.1/10.7/1 enables displaying the white point in the DCI-P3 color space with a deviation of delta u'v'≤+/−0.007. The DCI-P3 color space is particularly relevant for digital film projection.

According to at least one embodiment of the method for operating a visual display apparatus, the first, the second and the third operating currents are in a range from 0.5 mA to 2 mA, preferably from 0.8 mA to 1.2 mA and particularly preferably from 0.9 mA to 1.1 mA. When operating optoelectronic semiconductor components, a practical lower limit of the operating current is typically about 1 mA. This lower limit results inter alia from the accuracy, decreasing with the intensity of current, with which a constant current can be provided by a provided driver circuit. Furthermore, at very low operating currents, undesirable low-current effects can occur within the optoelectronic semiconductor component. An optimal operating current for the first the second and the third optoelectronic semiconductor component is a value of 1 mA. A value of the operating current that is as low as possible advantageously enables a particularly efficient operation of the display apparatus.

According to at least one embodiment of the method for operating a visual display apparatus, the ratio of parasitic capacitance to operating current is the same for the first, second and third semiconductor components up to a deviation of at most +−50%, preferably at most +−15%, particularly preferably at most +−5%. The parasitic capacitance of the first, second and third semiconductor components is influenced inter alia by their lateral surface area and the material systems used. The intrinsic switch-on delay of a semiconductor component is proportional to the ratio of the parasitic capacitance to the operating current of the semiconductor component. In order to achieve as equal as possible intrinsic switch-on delays of different semiconductor components, it is advantageous to make the ratio of the parasitic capacitances to the operating currents as equal as possible.

According to at least one embodiment of the method for operating a visual display apparatus, the first, second and third operating currents are equal within a deviation of +−50%, preferably within a deviation of +−20% and particularly preferably within a deviation of +−10%. A particularly advantageous embodiment of an optical display apparatus uses the same operating currents for all optoelectronic semiconductor components. Thus, an advantageously high energy efficiency can be achieved.

A visual display apparatus is further specified. In particular, the visual display apparatus can be operated by means of a method for operating described herein. That is, all features disclosed in connection with the method for operating a visual display apparatus are also disclosed for the visual display apparatus, and vice versa.

According to at least one embodiment of the optical display apparatus, the optical display apparatus comprises a first optoelectronic semiconductor component configured to emit electromagnetic radiation of a first wavelength and comprising a first intrinsic switch-on delay.

According to at least one embodiment of the optical display apparatus, the optical display apparatus comprises a second optoelectronic semiconductor component configured to emit electromagnetic radiation of a second wavelength and comprising a second intrinsic switch-on delay.

According to at least one embodiment of the visual display apparatus, the first wavelength and the second wavelength are different from each other.

According to at least one embodiment of the visual display apparatus, the first and/or the second optoelectronic semiconductor component are drivable by means of a delay clock signal.

According to at least one embodiment of the visual display apparatus, a difference between the first and the second intrinsic switch-on delay is reducible by means of the delay clock signal.

A lateral dimensioning of the optoelectronic semiconductor components may be selected such that the difference between the intrinsic switch-on delays of the first and second semiconductor components is reduced. In particular, the lateral dimensioning of the optoelectronic semiconductor components may include a side length or the surface area of the active area. In particular, by means of suitable lateral dimensions, the difference of the intrinsic switch-on delays can be reduced to such an extent that a remaining difference can be compensated with a predetermined number of delay clock signals.

According to at least one embodiment of the optical display apparatus, the optical display apparatus comprises a third optoelectronic semiconductor component configured to emit electromagnetic radiation of a third wavelength, wherein the third wavelength is different from the first and second wavelengths.

According to at least one embodiment of the visual display apparatus, the first wavelength is in the red spectral range, the second wavelength is in the green spectral range, and the third wavelength is in the blue spectral range.

According to at least one embodiment of the visual display apparatus, the first optoelectronic semiconductor component is based on a phosphide compound semiconductor material and the second and third optoelectronic semiconductor components are based on a nitride compound semiconductor material. Preferably, the first optoelectronic semiconductor component is formed with InGaAlP and the second and third optoelectronic semiconductor components are formed with InGaN.

"Based on phosphide compound semiconductor material" means in this context that the semiconductor component or at least a part thereof, particularly preferably at least the active zone, comprises or consists of a phosphide compound semiconductor material, preferably $Al_nGa_mIn_{1-n-m}P$ or $As_{n^-}Ga_mIn_{1-n-m}P$, wherein $0 \leq n \leq 1$, $0 \leq m \leq 1$ and $n+m \leq 1$. This material does not necessarily have to comprise a mathematically exact composition according to the above formula. Rather, it may comprise one or more dopants as well as additional constituents. For the sake of simplicity, however, the above formula includes only the essential constituents of the crystal lattice (Al or As, Ga, In, P), even if these may be partially replaced by small amounts of other substances.

"Based on nitride compound semiconductor material" means in the present context that the semiconductor component or at least a part thereof, particularly preferably at least the active zone, comprises or consists of a nitride compound semiconductor material, preferably $Al_nGa_mIn_{1-n-m}N$, wherein $0 \leq n \leq 1$, $0 \leq m \leq 1$ and $n+m \leq 1$. In this regard, this material need not necessarily comprise a mathematically exact composition according to the above formula. Rather, it may comprise, for example, one or more dopants as well as additional constituents. For the sake of simplicity, however, the above formula includes only the essential constituents of the crystal lattice (Al, Ga, In, N), even if these may be partially replaced and/or supplemented by small amounts of other substances.

According to at least one embodiment of the visual display apparatus, the first and the second semiconductor components comprise lateral areas having surface areas in the ratio of 3/1.5 to 4/1 inclusive and/or the second and the third semiconductor components comprise lateral areas having surface areas in the ratio of 1/1.5 to 1.5/1 inclusive. Furthermore, by adjusting the surface area, an adjustment of the parasitic capacitances can be achieved. If the ratio of the parasitic capacitances is set according to the surface area mentioned herein, approximately equal intrinsic switch-on delays of the first, second and third semiconductor components are obtained. An advantageously small difference of the intrinsic switch-on delays of the first, second and third semiconductor components results at an area ratio of the first, second and third semiconductor components of 4/1.2/1.

According to at least one embodiment of the optical display apparatus, a plurality of first, second, and third optoelectronic semiconductor components are arranged side by side in a common plane and comprise a common radiation direction. For example, display apparatus can thus be realized in the form of a display or a large-area video wall.

Further advantages and advantageous embodiments and further embodiments of the visual display apparatus and of the method for operating a visual display apparatus result from the following exemplary embodiments shown in connection with the figures.

Showing in:

FIG. 1 a schematic representation of a visual display apparatus described herein in a plan view, FIG. 2 a diagram of a time-dependent course of the luminous flux of an optical display apparatus with a first, second and third optoelectronic semiconductor component according to a first exemplary embodiment, FIG. 3 a diagram of a time-dependent course of the luminous flux of an optical display apparatus with a first, second and third optoelectronic semiconductor component according to a second exemplary embodiment, FIG. 4 a diagram of a time-dependent course of the luminous flux of an optical display apparatus with a first, second and third optoelectronic semiconductor component according to a third exemplary embodiment, FIG. 5 a diagram of a time-dependent course of the luminous flux of an optical display apparatus with a first, second and third optoelectronic semiconductor component according to a fourth exemplary embodiment, and FIG. 6 a time-dependent course of a first, second and third actuation signal for driving an optical display apparatus with a first, second and third optoelectronic semiconductor component.

Identical, similar, or similar-acting elements are indicated in the figures with the same reference signs. The figures and the proportions of the elements shown in the figures with respect to one another are not to be regarded as to scale. Rather, individual elements may be shown exaggeratedly large for better representability and/or for better comprehensibility.

Figure 1:
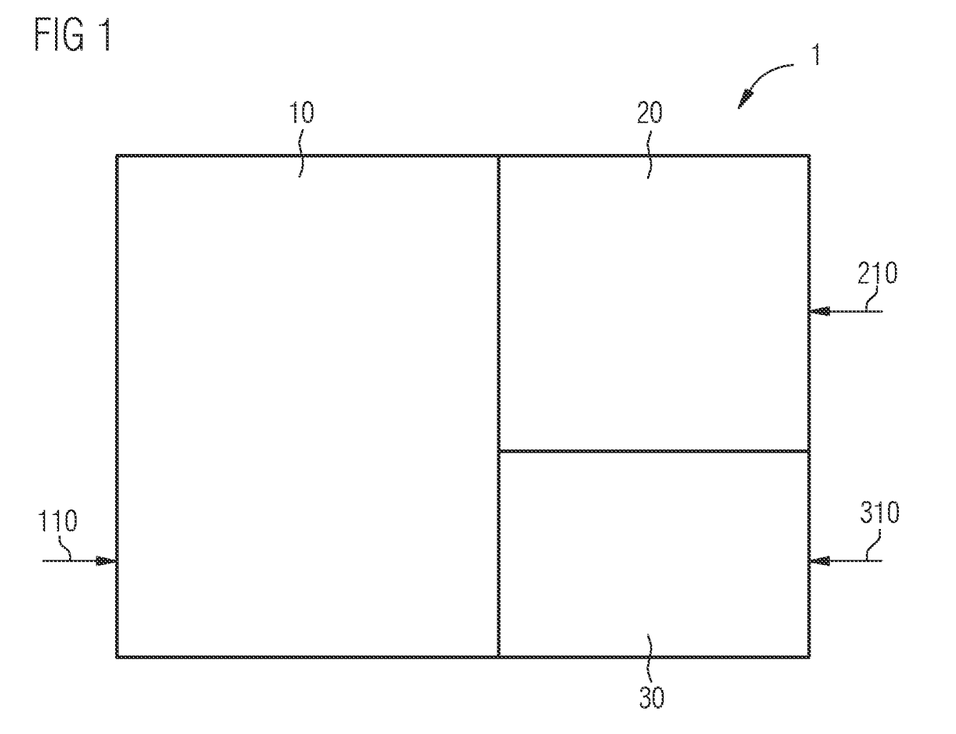

FIG. 1 shows a schematic representation of a visual display apparatus 1 described herein in a plan view. The optical display apparatus 1 comprises a first optoelectronic semiconductor component 10, a second optoelectronic semiconductor component 20 and a third optoelectronic semiconductor component 30. The optoelectronic semiconductor components are controlled by means of actuation signals 110, 210, 310. A first actuation signal 110 controls the first optoelectronic semiconductor component 10, a second actuation signal 210 controls the second optoelectronic semiconductor component 20, and a third actuation signal 310 controls the third optoelectronic semiconductor component 30.

For example, an optical display apparatus 1 includes a plurality of first, second and third optoelectronic semiconductor components 10, 20, 30. The optoelectronic semiconductor components 10, 20, 30 are arranged laterally adjacent to each other and have a common radiation direction. Each optoelectronic semiconductor component 10, 20, 30 can be configured to emit electromagnetic radiation with a different wavelength. For example, a large video screen or monitor for displaying color image content can be made in a simple manner. The optoelectronic semiconductor components 10, 20, 30 comprise different lateral surfaces. For example, the areas of the first, second and third semiconductor components have a ratio of 4/1.3/1 to each other.

Figure 2:
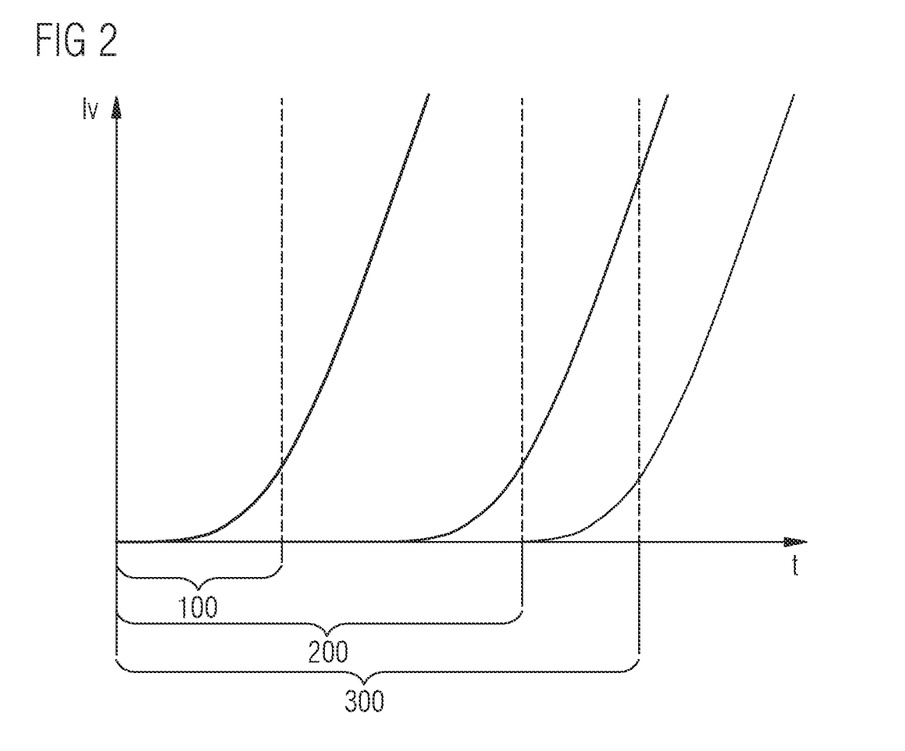

FIG. 2 shows a diagram of a time-dependent course of the luminous flux $I_v$ of a visual display apparatus 1 with a first, second and third optoelectronic semiconductor component 10, 20, 30 according to a first exemplary embodiment. Each of the optoelectronic semiconductor components 10, 20, 30 is configured to emit electromagnetic radiation with a different wavelength. This results in a different intrinsic switch-on delay 100, 200, 300 for each of the optoelectronic semiconductor components 10, 20, 30. The different intrinsic switch-on delays 100, 200, 300 may, for example, result from a different parasitic capacitance of the respective optoelectronic semiconductor components 10, 20, 30. Causes for a different parasitic capacitance can be, for example, different lateral dimensions of the active areas or, in particular, different band gaps in the different material systems used for the optoelectronic semiconductor components 10, 20, 30.

The lateral areas of the active regions of the optoelectronic semiconductor components 10, 20, 30 according to the first exemplary embodiment are adapted to have the same size within the manufacturing tolerances. The first intrinsic switch-on delay 100 of the first semiconductor component 10 is lowest, while the second intrinsic switch-on delay 200 of the second semiconductor component 20 is slightly higher, and the third intrinsic switch-on delay 300 of the third semiconductor component 30 is highest. Thus, when the first, second and third semiconductor components 10, 20, 30 are driven simultaneously, the first optoelectronic semiconductor component 10 emits electromagnetic radiation first, and then the second and third optoelectronic semiconductor components 20, 30 emit their electromagnetic radiation at a short time interval from each other.

Such staggered emission of electromagnetic radiation with different wavelengths may no longer be perceived as a single mixed color by an observer, but may give the impression of a sequence of different color perceptions. Furthermore, such a high temporal difference between the switch-on times can lead to the fact that the semiconductor components 10, 20, 30 with the highest intrinsic switch-on delay 100, 200, 300 can only be partially or not at all excited to emit within a limited time window during the display of moving image contents. In the exemplary embodiment shown here, this affects the second and third semiconductor components 20, 30. This can result in an undesired deviation in the displayed mixed color, since the components of the second and third semiconductor components 20, 30 may contribute too little or not at all to the mixed color.

Figure 3:
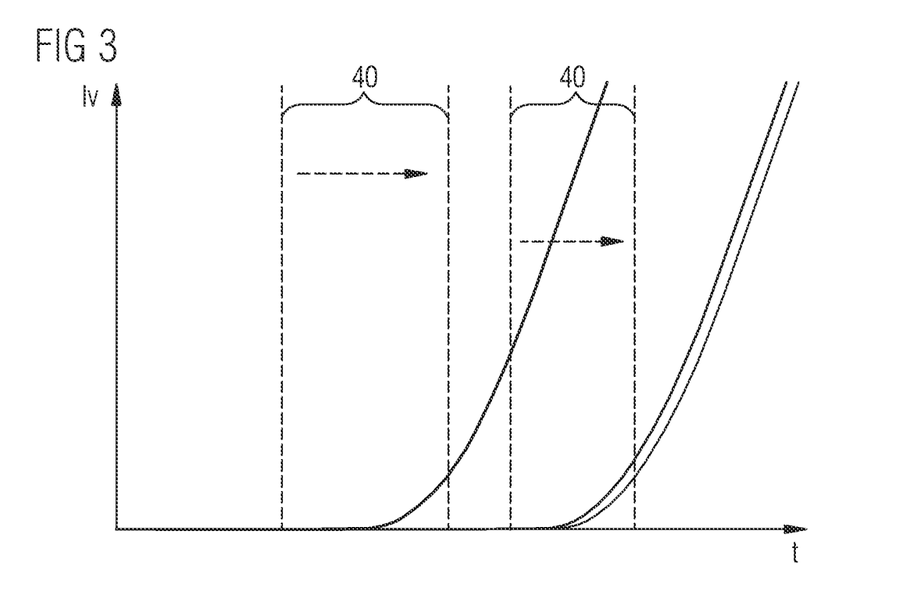

FIG. 3 shows a diagram of a time-dependent course of the luminous flux $I_v$ of an optical display apparatus 1 with a first, second and third optoelectronic semiconductor component 10, 20, 30 according to a second exemplary embodiment. With the aid of a delay clock signal 40 of a defined length, a difference in intrinsic switch-on delay 100, 200 of the first and second optoelectronic semiconductor components 10, 20 can already be partially compensated.

The difference in the second and third intrinsic switch-on delay 200, 300 between the second and third optoelectronic semiconductor components 20, 30 is smaller than or equal to a length of the delay clock signal 40 and can thus be almost completely compensated. However, compensation for the substantially smaller first intrinsic switch-on delay 100 of the first optoelectronic semiconductor component 10 can only be partial, since the maximum length of the delay clock signal 40 is smaller than the difference between the first intrinsic switch-on delay 100 and the third intrinsic switch-on delay 300. As a result, there is still a perceptible difference in the switch-on delay of the first and the second and third optoelectronic semiconductor components 10, 20, 30.

Figure 4:
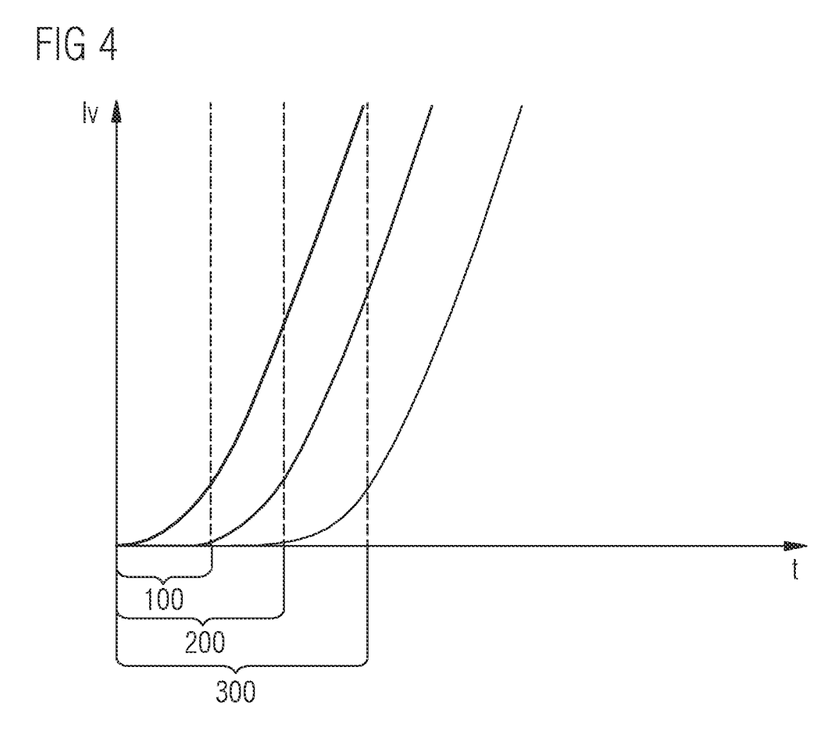

FIG. 4 shows a diagram of a time-dependent course of the luminous flux $I_v$ of a visual display apparatus 1 with a first, second and third optoelectronic semiconductor component 10, 20, 30 according to a third exemplary embodiment. The optoelectronic semiconductor components 10, 20, 30 used in this case comprise matched lateral expansions. In other words, the lateral areas of the optoelectronic semiconductor components 10, 20, 30 is adjusted to each other in such a way that the intrinsic switch-on delays 100, 200, 300 are as equal as possible. For example, the lateral extent of the second and third semiconductor components 20, 30 can be reduced compared to the lateral area of the first semiconductor component 10 in order to reduce the parasitic capacitances and the second and third intrinsic switch-on delays 200, 300.

Figure 5:
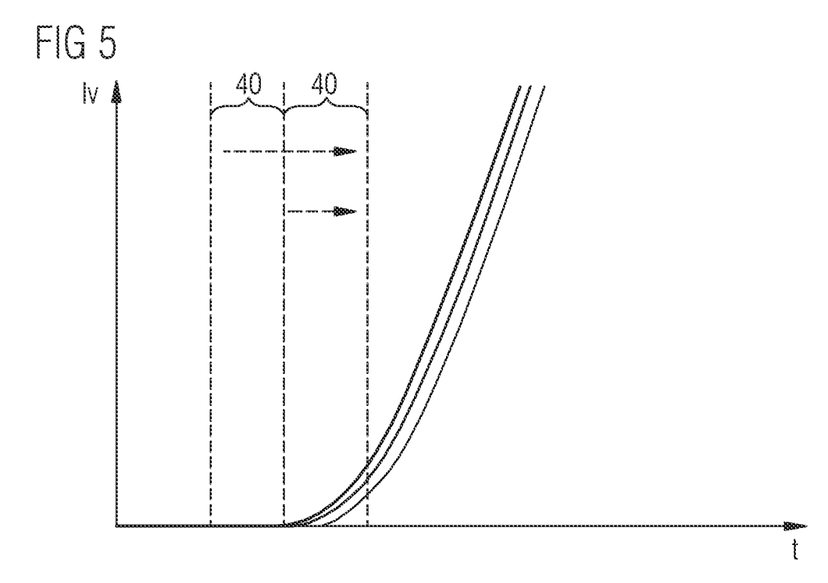

FIG. 5 shows a diagram of a time-dependent course of the luminous flux $I_v$ of a visual display apparatus 1 with first, second and third optoelectronic semiconductor components 10, 20, 30 in accordance with a fourth exemplary embodiment. The fourth exemplary embodiment shows a combination of the second and third exemplary embodiments. By means of a further compensation of the intrinsic switch-on delays 100, 200, 300 by driving the semiconductor components 10, 20, 30 with delay clock signals 40, a remaining difference of the switch-on delays after the adjustment of the lateral expansions of the active regions of the semiconductor components 10, 20, 30 can be further reduced. The first switch-on delay, the second switch-on delay and the third switch-on delay comprise an approximately equal value.

The intrinsic switch-on delays 100, 200, 300 already set to a smaller differential amount by means of the method described in the third exemplary embodiment can now be compensated almost completely by means of the delay by a delay clock signal 40. The compensation may be up to a limit specified by the discretization of the delay clock signal 40. For example, a residual time deviation between the different switch-on delays may remain which is smaller than the length of a clock cycle 50 of the delay clock signal 40. A nearly simultaneous emission of different semiconductor components 10, 20, 30 is perceived by an observer as a mixed color. Thus, even when dark image contents are displayed with a thereby shortened turn-on time of the semiconductor components 10, 20, 30, the display of a mixed color involving all semiconductor components 10, 20, 30 is advantageously simplified.

Figure 6:
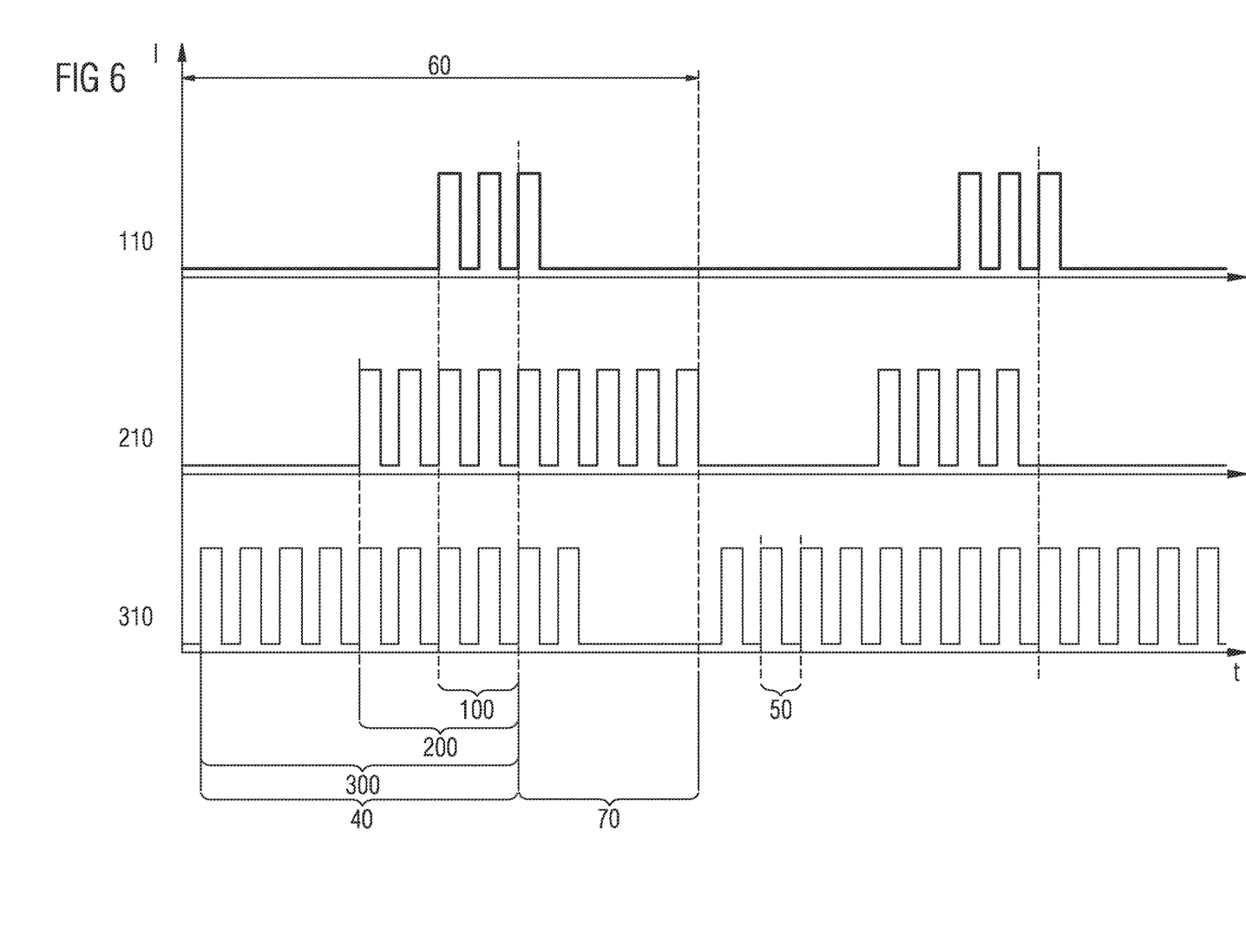

FIG. 6 shows a time-dependent course of a first, second and third actuation signal 110, 210, 310 for driving an optical display apparatus 1 with a first, second and third optoelectronic semiconductor component 10, 20, 30. The first actuation signal 110 is assigned to a first semiconductor chip 10, the second actuation signal 210 to a second semiconductor chip 20 and the third actuation signal 310 to a third semiconductor chip 30. The first semiconductor chip 10 is designed to emit electromagnetic radiation in the red spectral range, the second semiconductor chip 20 is designed to emit electromagnetic radiation in the green spectral range, and the third semiconductor chip 30 is designed to emit electromagnetic radiation in the blue spectral range. The control enables the display of moving image contents in the form of a video signal with a certain frame repetition frequency. The refresh rate is typically 60 Hz. This results in a display time 60 of 1/60 s. Within the available display time 60, both the delay clock signal 40 and the display signal 70 are included in each actuation signal 110, 210, 310. The delay clock signal 40 makes it possible to compensate for the different intrinsic switch-on delays 100, 200, 300 of the semiconductor components 10, 20, 30 and thus to synchronize the turn-on times with respect to time.

The display signal 70 serves a representation of the desired color value with a desired intensity. The color value and the radiation intensity are adjusted by controlling the individual intensities of the radiation emission of the semiconductor components 10, 20, 30 via pulse width modulation. The frequency of the display signal 70 corresponds to the frequency of the delay clock signal 40. Depending on the existing intrinsic switch-on delay 100, 200, 300 of the respective optoelectronic semiconductor components 10, 20, 30, more or less clock cycles 50 of the delay clock signal 40 are executed in order to match the turn-on times of the respective optoelectronic semiconductor components 10, 20, 30. The better the adjustment of the intrinsic switch-on delays 100, 200, 300 by means of the adjustment of the lateral dimensions, the fewer delay clock signals 40 are required. As a result, the available display time 70 increases. This has a beneficial effect on the color dynamics and the maximum achievable brightness of the display apparatus 1.

The first optoelectronic semiconductor component 10 provided for emission of an electromagnetic radiation in the red spectral range comprises the smallest intrinsic switch-on delay 100 and consequently also only two clock cycles 50 of the delay clock signal 40. The second optoelectronic semiconductor component 20 intended to emit electromagnetic radiation in the green spectral range comprises the second largest intrinsic switch-on delay 200 and consequently four clock cycles 50 of the delay clock signal 40. The third optoelectronic semiconductor component 30 intended to emit electromagnetic radiation in the blue spectral range comprises the largest intrinsic switch-on delay 300 and consequently eight clock cycles 50 of the delay clock signal 40.

The invention is not limited by the description based on the exemplary embodiments. Rather, the invention encompasses any new feature as well as any combination of features, which particularly includes any combination of features in the patent claims, even if that feature or combination itself is not explicitly specified in the patent claims or exemplary embodiments.

LIST OF REFERENCE SIGNS

1 visual display apparatus
10 first optoelectronic semiconductor component
20 second optoelectronic semiconductor component
30 third optoelectronic semiconductor component
40 delay clock signal
50 clock cycle
60 display time
70 display signal
100 first intrinsic switch-on delay
200 second intrinsic switch-on delay
300 third intrinsic switch-on delay
110 first actuation signal
210 second actuation signal
310 third actuation signal

The invention claimed is:

1. A method for operating a visual display apparatus, wherein
the visual display apparatus comprises a first optoelectronic semiconductor component configured to emit electromagnetic radiation of a first wavelength and having a first intrinsic switch-on delay,
the visual display apparatus comprises a second optoelectronic semiconductor component configured to emit electromagnetic radiation of a second wavelength and comprising a second intrinsic switch-on delay, wherein the second wavelength is different from the first wavelength,
the first semiconductor component is operated with a first operating current in accordance with a first actuation signal,
the second semiconductor component is operated with a second operating current in accordance with a second actuation signal, and
the first and/or the second actuation signal comprises a delay clock signal selected such that the electromagnetic radiation emissions of the first and second semiconductor component comprise a switch-on delay with respect to each other that is smaller than a difference of the first and second intrinsic switch-on delays.

2. The method for operating the visual display apparatus according to claim 1, wherein
the first and second actuation signals comprise a frequency in the range of 10 MHz to 30 MHz.

3. The method for operating the visual display apparatus according to claim 1, wherein
the delay clock signal comprises a frequency in the range of 10 MHz to 30 MHz.

4. The method for operating the visual display apparatus according to claim 1, wherein
the delay clock signal comprises a predetermined number of clock cycles.

5. The method for operating the visual display apparatus according to claim 4, wherein
the delay clock signal comprises at most 16 clock cycles.

6. The method for operating the visual display apparatus according to claim 1, wherein
the visual display apparatus comprises a third optoelectronic semiconductor component which is configured to emit electromagnetic radiation of a third wavelength, which comprises a third intrinsic switch-on delay and which is operated with a third operating current according to a third actuation signal comprising a delay clock signal, wherein
the third wavelength is different from the first and second wavelengths, and
the delay clock signal is selected such that the emissions of the electromagnetic radiation of the first and third semiconductor components comprise a switch-on delay with respect to each other which is smaller than a difference of the first and third intrinsic switch-on delays, and/or the emissions of the electromagnetic radiation of the second and the third semiconductor components comprise a switch-on delay with respect to each other that is smaller than a difference of the second and the third intrinsic switch-on delay.

7. The method for operating the visual display apparatus according to claim 6, wherein
the first wavelength is in the red spectral range, the second wavelength is in the green spectral range, and the third wavelength is in the blue spectral range.

8. The method for operating the visual display apparatus according to claim 6, wherein
luminances of the first and the second semiconductor components are in a ratio of 1/10 to 1/2 inclusive, and/or
luminances of the second and third semiconductor components are in a ratio of 4/1 to 15/1 inclusive.

9. The method for operating the visual display apparatus according to claim 6, wherein
the first, second and third operating currents are in a range from 0.5 mA to 2 mA.

10. The method for operating the visual display apparatus according to claim 9, wherein
the first, second and third operating currents are in a range from 0.8 mA to 1.2 mA.

11. The method for operating the visual display apparatus according to claim 6, wherein
the semiconductor components comprise parasitic capacitances, and the ratio of parasitic capacitance to operating current is the same for the first, second and third semiconductor components up to a deviation of at most +−50%.

12. The method for operating the visual display apparatus according to claim 11, wherein
the semiconductor components comprise parasitic capacitances, and the ratio of parasitic capacitance to operating current is the same for the first, second and third semiconductor components up to a deviation of at most +−15%.

13. The method for operating the visual display apparatus according to claim 1, wherein
the first, second and third operating currents are equal within a deviation of +−50%.

14. The method for operating the visual display apparatus according to claim 13, wherein
the first, second and third operating currents are equal with a deviation of at most +−20%.

15. A visual display apparatus comprising
a first optoelectronic semiconductor component which is configured to emit electromagnetic radiation of a first wavelength and having a first intrinsic switch-on delay,
a second optoelectronic semiconductor component configured to emit electromagnetic radiation of a second wavelength and having a second intrinsic switch-on delay, wherein
the first and second wavelengths are different from each other,
the first and/or the second semiconductor component is drivable by a delay clock signal, and
a difference between said first and second intrinsic switch-on delays is reducible by means of said delay clock signal.

16. The visual display apparatus according to claim 15, comprising
a third optoelectronic semiconductor component configured to emit electromagnetic radiation of a third wavelength, wherein the third wavelength is different from the first and second wavelengths.

17. The visual display apparatus according to claim 16, in which
the first wavelength is in the red spectral range, the second wavelength is in the green spectral range, and the third wavelength is in the blue spectral range.

18. The visual display apparatus according to claim 17, in which
the first optoelectronic semiconductor component is based on a phosphide compound semiconductor material, and the second and third optoelectronic semiconductor components are based on a nitride compound semiconductor material.

19. The visual display apparatus according to claim 17, in which
the first and the second semiconductor component comprise lateral areas having surface areas in the ratio of 3/1.5 to 4/1, inclusive, and/or
the second and the third semiconductor components comprise lateral areas having surface areas in the ratio of 1/1.5 to 1.5/1, inclusive.

20. The visual display apparatus according to claim 15, in which
a plurality of first, second and third optoelectronic semiconductor components are arranged side by side in a common plane and comprise a common radiation direction.

* * * * *